(12) United States Patent
Yang et al.

(10) Patent No.: US 11,832,486 B2
(45) Date of Patent: Nov. 28, 2023

(54) SEMICONDUCTOR DEVICE, DISPLAY PANEL, AND DISPLAY DEVICE INCLUDING THE SAME

(71) Applicant: ELECTRONICS AND TELECOMMUNICATIONS RESEARCH INSTITUTE, Daejeon (KR)

(72) Inventors: Jong-Heon Yang, Daejeon (KR); Seung Youl Kang, Daejeon (KR); Yong Hae Kim, Daejeon (KR); Hee-ok Kim, Daejeon (KR); Jeho Na, Daejeon (KR); Jaehyun Moon, Daejeon (KR); Chan Woo Park, Daejeon (KR); Himchan Oh, Daejeon (KR); Seong-Mok Cho, Daejeon (KR); Sung Haeng Cho, Daejeon (KR); Ji Hun Choi, Daejeon (KR); Jae-Eun Pi, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/943,528

(22) Filed: Sep. 13, 2022

(65) Prior Publication Data

US 2023/0083225 A1 Mar. 16, 2023

(30) Foreign Application Priority Data

Sep. 14, 2021 (KR) .................. 10-2021-0122688
Sep. 1, 2022 (KR) .................. 10-2022-0110739

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *G09G 3/3266* (2013.01);
(Continued)

(58) Field of Classification Search
CPC .............. H10K 59/131; H01L 29/8122; H01L 29/8124; H01L 29/7926; H01L 29/7889;
(Continued)

(56) References Cited

U.S. PATENT DOCUMENTS 6,770,534 B2 8/2004 Cho et al.
6,800,874 B2 10/2004 Hsieh
(Continued)

FOREIGN PATENT DOCUMENTS

JP 2017-17208 A 1/2017
KR 10-0390920 B1 7/2003
(Continued)

*Primary Examiner* — Sardis F Azongha
(74) *Attorney, Agent, or Firm* — LRK PATENT LAW FIRM

(57) ABSTRACT

Provided are a semiconductor device, a display panel, and a display device including the same. The semiconductor device includes a lower electrode on one side of a substrate, a spacer on another side of the substrate, a middle electrode on the spacer, a lower channel layer on portions of a sidewall of the spacer, the middle electrode, and the lower electrode, a lower gate insulating layer on the lower channel layer, a common gate electrode on the gate insulating layer, an upper gate insulating layer on the common gate electrode, an upper electrode on the spacer and the upper gate insulating layer of the middle electrode, an upper channel layer connected to the upper electrode and disposed on a sidewall of the upper gate insulating layer, and a contact electrode connected to a portion of the upper channel layer and passing through the lower gate insulating layer and the upper gate insulating (Continued)

layer outside the common gate electrode so as to be connected to the lower electrode.

20 Claims, 7 Drawing Sheets

(51) Int. Cl.
    *G09G 3/3266*     (2016.01)
    *H10K 59/124*     (2023.01)

(52) U.S. Cl.
    CPC ............... *G09G 2300/0426* (2013.01); *G09G 2300/0814* (2013.01); *G09G 2300/0842* (2013.01); *H10K 59/124* (2023.02)

(58) Field of Classification Search
    CPC ......... H01L 29/78642; H01L 29/78645; H01L 29/7827
    See application file for complete search history.

(56) References Cited

U.S. PATENT DOCUMENTS

| | | | |
|---|---|---|---|
| 8,067,767 | B2 | 11/2011 | Yun et al. |
| 8,405,137 | B2 | 3/2013 | Huo et al. |
| 9,202,849 | B2 | 12/2015 | Lee et al. |
| 9,658,121 | B2 | 5/2017 | Inoue et al. |
| 9,831,350 | B2 | 11/2017 | Moon et al. |
| 10,121,981 | B2 | 11/2018 | Ali et al. |
| 10,249,236 | B2 | 4/2019 | Choi |
| 10,340,293 | B2 | 7/2019 | Noh et al. |
| 10,396,140 | B2 | 8/2019 | Kim et al. |
| 10,431,641 | B2 | 10/2019 | Hwang et al. |
| 10,468,534 | B2 | 11/2019 | Koo et al. |
| 10,483,401 | B2 | 11/2019 | Bu |
| 10,651,210 | B2 | 5/2020 | Kim et al. |
| 10,825,398 | B2 | 11/2020 | Kang et al. |
| 11,004,870 | B2 | 5/2021 | Lee et al. |
| 11,069,814 | B2 | 7/2021 | Sung et al. |
| 11,177,390 | B2 | 11/2021 | Cho et al. |
| 11,183,535 | B2 | 11/2021 | Choi |
| 2013/0161732 | A1 | 6/2013 | Hwang et al. |
| 2017/0005200 | A1 | 1/2017 | Sasaki |
| 2020/0161476 | A1 | 5/2020 | Sung et al. |

FOREIGN PATENT DOCUMENTS

| | | |
|---|---|---|
| KR | 10-0702014 B1 | 3/2007 |
| KR | 10-2010-0072568 A | 7/2010 |
| KR | 10-2012-0014380 A | 2/2012 |
| KR | 10-2014-0123329 A | 10/2014 |
| KR | 10-2016-0087024 A | 7/2016 |
| KR | 10-2017-0045781 A | 4/2017 |
| KR | 10-2017-0109114 A | 9/2017 |
| KR | 10-2017-0124128 A | 11/2017 |
| KR | 10-2017-0128665 A | 11/2017 |
| KR | 10-2018-0039210 A | 4/2018 |
| KR | 10-2018-0085404 A | 7/2018 |
| KR | 10-2018-0085850 A | 7/2018 |
| KR | 10-2019-0093240 A | 8/2019 |
| KR | 10-2020-0042989 A | 4/2020 |
| KR | 10-2020-0057219 A | 5/2020 |
| KR | 10-2020-0059016 A | 5/2020 |
| WO | 2021/054617 A1 | 3/2021 |

SEMICONDUCTOR DEVICE, DISPLAY PANEL, AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2021-0122688, filed on Sep. 14, 2021, and No. 10-2022-0110739, field on Sep. 1, 2022, the entire contents of which are hereby incorporated by reference.

BACKGROUND

The present disclosure herein relates to a semiconductor device, and more particularly, to a semiconductor that is capable of improving productivity.

In recent years, various display devices are being developed. A display device may largely include a liquid crystal display device and an organic light emitting display device. Among them, the organic light emitting display device may be an active light emitting device. The organic light emitting display device is being employed in the latest AR/VR technologies, light field displays, and holograms. Like this, the organic light emitting display device may realize ultra-high integration resolution.

SUMMARY

The present disclosure provides a semiconductor device, in which a driving circuit is reduced in area.

An embodiment of the inventive concept provides a semiconductor device. The semiconductor device includes: a lower electrode on one side of a substrate; a spacer on a portion of the lower electrode and another side of the substrate; a middle electrode on the spacer; a lower channel layer on portions of a sidewall of the spacer, the middle electrode, and the lower electrode; a lower gate insulating layer on the lower channel layer; a common gate electrode on the gate insulating layer corresponding to the lower channel layer; an upper gate insulating layer on the common gate electrode; an upper electrode on the spacer and the upper gate insulating layer of the middle electrode; an upper channel layer connected to the upper electrode and disposed on a sidewall of the upper gate insulating layer; and a contact electrode connected to a portion of the upper channel layer and passing through the lower gate insulating layer and the upper gate insulating layer outside the common gate electrode so as to be connected to the lower electrode.

In an embodiment, the lower channel layer, the lower gate insulating layer, and the common gate electrode may be an n-type thin film transistor.

In an embodiment, the upper channel layer, the upper gate insulating layer, and the common gate electrode may be a p-type thin film transistor.

In an embodiment, the lower gate insulating layer may be thicker than the upper gate insulating layer.

In an embodiment, the middle electrode may have a thickness different from that of each of the lower electrode and the upper electrode.

In an embodiment, the middle electrode may be thicker than each of the lower electrode and the upper electrode.

In an embodiment, the semiconductor device may further include: an upper spacer provided between the middle electrode and the lower gate insulating layer; and an additional electrode between the upper spacer and the lower gate insulating layer.

In an embodiment, the common gate electrode may be wider than each of the lower channel layer and the upper channel layer.

In an embodiment, the semiconductor device may further include: a lower buffer spacer between a sidewall of the spacer and the lower channel layer; and an upper buffer spacer on a sidewall of the upper channel layer.

In an embodiment, the lower buffer spacer and upper buffer spacer may be thicker than the lower electrode.

In an embodiment of the inventive concept, a display panel includes: a data line on one side of a substrate; a power electrode on another side of the substrate; a spacer on the substrate between the data line and the power electrode; a middle electrode on the spacer; a lower channel layer configured to connect the middle electrode to the data line along one sidewall of the spacer; a lower gate insulating layer on the lower channel layer, the middle electrode, the data line, and the power electrode; a scan line on the lower gate insulating layer of one sidewall of the spacer; a driving gate electrode on the lower gate insulating layer of another sidewall of the spacer; an upper gate insulating layer on the scan line and the driving gate electrode; an upper electrode on the upper gate insulating layer of the spacer; an upper channel layer connected to the upper electrode and disposed on the upper gate insulating layer of another sidewall of the spacer; a contact electrode connected to the upper channel layer and passing through the lower gate insulating layer and the upper gate insulating layer so as to be connected to the power electrode; a first interlayer insulating layer on the contact electrode, the upper channel layer, the upper electrode, and the upper gate insulating layer; an anode provided on the first interlayer insulating layer and passing through the first interlayer insulating layer so as to be connected to the upper electrode; a second interlayer insulating layer on both edges of the anode and the first interlayer insulating layer; a light emitting layer on the anode and the second interlayer insulating layer; and a cathode on the light emitting layer.

In an embodiment, the scan line may have a length greater than that of the lower channel layer.

In an embodiment, the upper channel layer may have a length less than that of the driving gate electrode.

In an embodiment, the driving gate electrode may pass through the lower gate insulating layer so as to be connected to the middle electrode.

In an embodiment, the display panel may further include a protective layer on the cathode.

In an embodiment of the inventive concept, a display device includes: a display panel; and a driving circuit having a semiconductor device connected to an edge of the display panel to provide a scan signal and a data signal that control the display panel. The semiconductor device may include: a lower electrode on one side of a first substrate; a spacer on a portion of the lower electrode and another side of the first substrate; a middle electrode on the spacer; a lower channel layer on portions of a sidewall of the spacer, the middle electrode, and the lower electrode; a lower gate insulating layer on the lower channel layer; a common gate electrode on the gate insulating layer corresponding to the lower channel layer; an upper gate insulating layer on the common gate electrode; an upper electrode on the spacer and the upper gate insulating layer of the middle electrode; an upper channel layer connected to the upper electrode and disposed on a sidewall of the upper gate insulating layer; and a contact electrode connected to a portion of the upper channel layer and passing through the lower gate insulating layer and the upper gate insulating layer outside the common gate electrode so as to be connected to the lower electrode.

In an embodiment, the semiconductor device may include an inverter circuit.

In an embodiment, the display panel may include: a data line extending from a second substrate in one direction; and a scan line crossing the data line. The semiconductor device may be connected to the scan line.

In an embodiment, the driving circuit may include: a scan driving circuit connected to an edge of one side of the display panel; and a data driving circuit arranged to cross the scan driving circuit.

In an embodiment, the scan driving circuit may include the semiconductor device.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
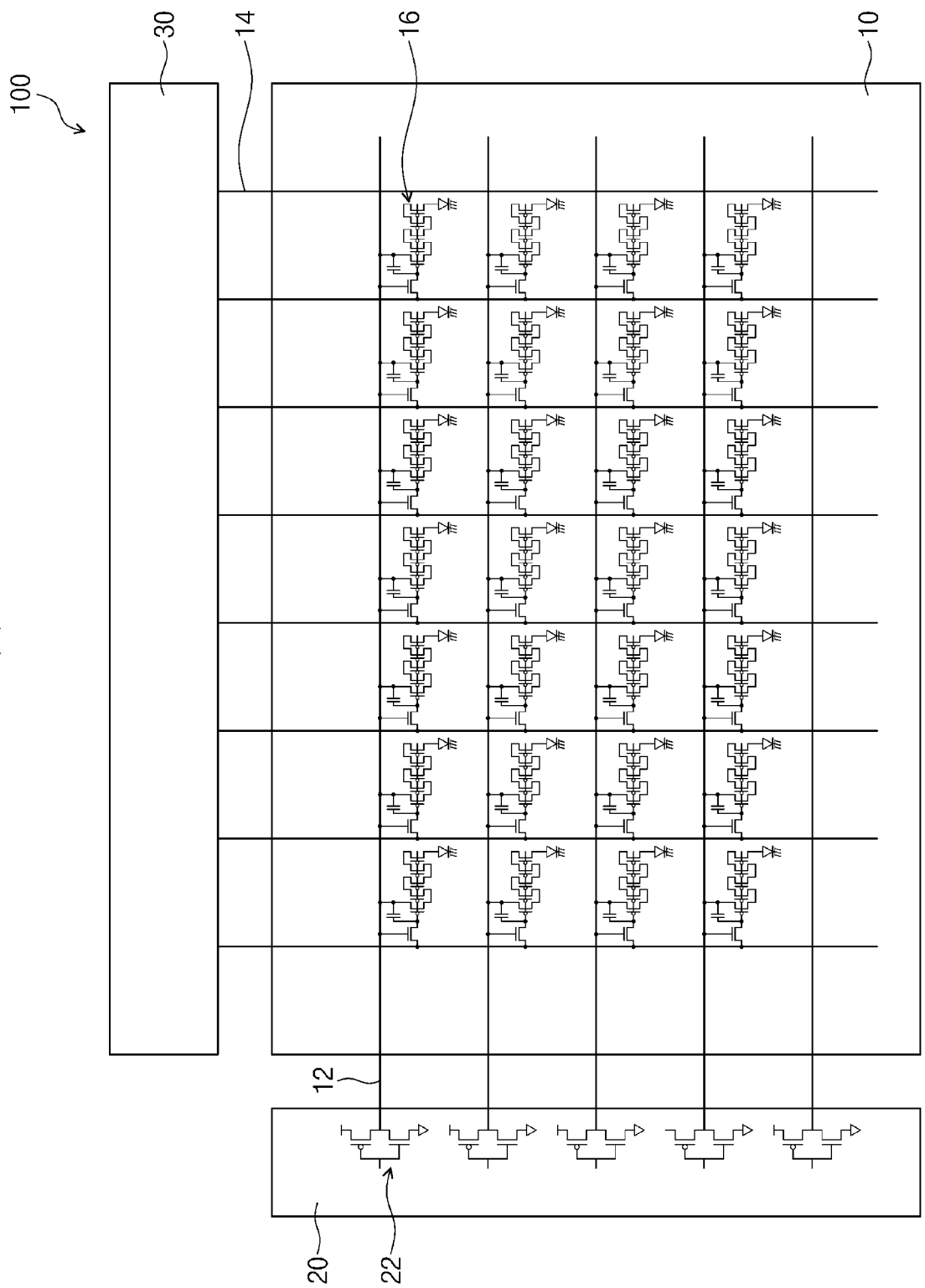
FIG. 1 is a block diagram illustrating an example of a display device according to an embodiment of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. In this specification, the terms of a singular form may comprise plural forms unless specifically mentioned. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Thus, regions illustrated in the figures have schematic properties, and shapes of the regions illustrated in the figures exemplify specific forms of the regions of elements and are not intended to limit the scope of the invention.

FIG. 1 is a view illustrating an example of a display device 100 according to an embodiment of the inventive concept.

Referring to FIG. 1, the display device 100 according to an embodiment of the inventive concept may include an organic light emitting diode (OLED). Alternatively, the display device 100 may include a liquid crystal display, but an embodiment of the inventive concept is not limited thereto. According to an embodiment of the inventive concept, the display device 100 according to an embodiment of the inventive concept may include a display panel 10, a scan driving circuit 20, and a data driving circuit 30.

The display panel 10 may be connected to the scan driving circuit 20 and the data driving circuit 30. According to an embodiment of the inventive concept, the display panel 10 may include a scan line 12, a data line 14, and pixels 16. The scan line 12 may extend in one direction. The data line 14 may cross the scan line 12. The pixels 16 may be defined by the scan line 12 and the data line 14. The pixels 16 may display an image using a data signal of the data line 14 and a scan signal of the scan line 12.

The scan driving circuit 20 may be provided on a side surface of one side of the display panel 10. The scan driving circuit 20 may be connected to the scan line 12 of the display panel 10. The scan driving circuit 20 may provide the scan signal to the scan line 12. According to an embodiment of the inventive concept, the scan driving circuit 20 may include a semiconductor device 22 provided with an inverter circuit.

The data driving circuit 30 may be arranged in a direction different from that of the scan driving circuit 20. The data driving circuit 30 may be provided on a side surface of an upper portion of the display panel 10. The data driving circuit 30 may be connected to the data line 14. The data driving circuit 30 may provide the data signal to the data line 14. Although not shown, the data driving circuit 30 may include string resistors, but an embodiment of the inventive concept is not limited thereto.

Figure 2:
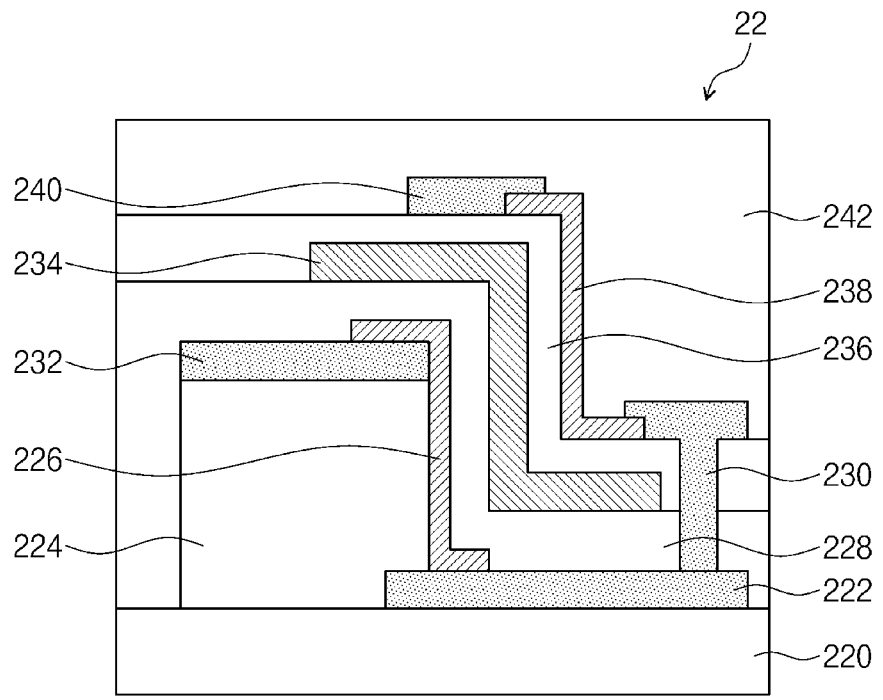
FIG. 2 is a cross-sectional view illustrating an example of a semiconductor device of FIG. 1.

FIG. 2 is a view illustrating an example of the semiconductor device 22 of FIG. 1.

Referring to FIG. 2, the semiconductor device 22 may include an inverter circuit. According to an embodiment of the inventive concept, the semiconductor device 22 may include a first substrate 220, a first lower electrode 222, a first spacer 224, a first middle electrode 232, a first lower channel layer 226, a first lower gate insulating layer 228, a common gate electrode 234, a first upper gate insulating layer 236, a first upper channel layer 238, a first upper electrode 240, a first contact electrode 230, and a first protective layer 242.

The first substrate 220 may include a flat base substrate. The first substrate 220 may include glass, polyimide, silicon, or sapphire, but an embodiment of the inventive concept is not limited thereto.

The first lower electrode 222 may be provided at one side of the first substrate 220. The first lower electrode 222 may include metal oxide such as indium tin oxide, indium zinc oxide, and aluminum zinc oxide. Alternatively, the first lower electrode 222 may include molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag). The first lower electrode 222 may include a multilayer structure of Mo—Al—Mo, Mo-ITO, ITO-Ag-ITO, or AZO-Ag-AZO.

The first spacer 224 may be provided on a portion of the first lower electrode 222 and on another side of the first substrate 220. The first spacer 224 may have a thickness greater than that of the first lower electrode 222. For example, the first spacer 224 may include silicon oxide ($SiO_2$). Alternatively, the first spacer 224 may include silicon nitride ($SiN_x$), silicon nitride oxide ($SiO_xN_y$), and aluminum oxide ($Al_2O_3$). In addition, the first spacer 224 may include a carbon-containing silicon oxide film (SiOC or SiOCH) and a siloxane polymer. Each of the carbon-containing silicon oxide film (SiOC or SiOCH) and the siloxane polymer may have a dielectric constant less than that of silicon oxide and may reduce overlap capacitance between the first lower electrode 222 and the first upper electrode 240. The first spacer 224 is formed through a thin film formation process such as plasma-enhanced chemical vapor deposition (PECVD), atomic layer deposition (ALD), or a solution process insulating film (spin-on-dielectric).

The first middle electrode 232 may be provided on the first spacer 224. The first middle electrode 232 may include the same material as that of the first lower electrode 222. For example, the first middle electrode 232 may include metal oxide such as tin oxide (Indium Tin Oxide), indium zinc oxide (Indium Zinc Oxide), and aluminum zinc oxide (Aluminum Zinc Oxide), a metal such as molybdenum (Mo), aluminum (Al)), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The first lower channel layer 226 may be connected between the first lower electrode 222 and the first middle electrode 232. The first lower channel layer 226 may be provided on one sidewall of the first spacer 224. The first lower channel layer 226 may include amorphous silicon (a-Si), low temperature polysilicon (LTPS), or an n-type oxide semiconductor. Among them, the n-type oxide semiconductors may include indium gallium zinc oxide (IGZO), indium tin zinc oxide (ITZO), indium zinc oxide (IZO), indium oxide ($InO_x$), zinc tin oxide (ZTO), and indium gallium tin oxide (IGTO), and indium gallium zinc tin oxide (IGZTO). The first lower channel layer 226 may be formed through sputtering, plasma chemical vapor deposition (PECVD), or atomic layer deposition (ALD).

The first lower gate insulating layer 228 may be disposed on the first lower channel layer 226, the first middle electrode 232, the first lower electrode 222, and the first substrate 220. As a first example, the lower gate insulating layer 228 may include silicon oxide ($SiO_2$), silicon nitride ($SiN_x$), silicon nitride oxide ($SiO_xN_y$), aluminum oxide ($Al_2O_3$), hafnium oxide ($HfO_x$), and zirconium oxide ($ZrO_x$). The first lower gate insulating layer 228 may be formed through plasma chemical vapor deposition (PECVD) or atomic layer deposition (ALD).

The common gate electrode 234 may be provided on the first lower gate insulating layer 228. The common gate electrode 234 may be provided above the first lower electrode 222, the first middle electrode 232, and the first lower channel layer 226. The common gate electrode 234 may have a length greater than that of the first lower channel layer 226 in a vertical view. The common gate electrode 234 may include the same material as that of each of the first lower electrode 222 and the first middle electrode 232. For example, the common gate electrode 234 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO. The first lower channel layer 226, the first lower gate insulating layer 228, and the common gate electrode 234 may be a top gate thin film transistor or an n-type thin film transistor.

The first upper gate insulating layer 236 may be provided on the common gate electrode 234 and the first lower gate insulating layer 228. The first upper gate insulating layer 236 may have the same thickness as the first lower gate insulating layer 228. The first upper gate insulating layer 236 may include the same material as that of the first lower gate insulating layer 228. For example, the first upper gate insulating layer 236 may include silicon oxide ($SiO_2$), silicon nitride ($SiN_x$), silicon nitride oxide ($SiO_xN_y$), aluminum oxide ($Al_2O_3$), hafnium oxide ($HfO_x$), and zirconium oxide ($ZrO_x$). The first upper gate insulating layer 236 may be formed through plasma chemical vapor deposition (PECVD) or atomic layer deposition (ALD).

The first upper channel layer 238 may be provided on one sidewall of the first upper gate insulating layer 236. The first upper channel layer 238 may be provided above the common gate electrode 234. The first upper channel layer 238 may be connected between the first upper electrode 240 and the first contact electrode 230. The first upper channel layer 238 may have a length similar to that of the first lower channel layer 226 in a vertical view. The first upper channel layer 238 may have a length less than that of the common gate electrode 234. The first upper channel layer 238 may have conductivity different from that of the first lower channel layer 226. According to an embodiment of the inventive concept, the first upper channel layer 238 may include a p-type oxide semiconductor. The p-type oxide semiconductor may include copper oxide (CuO) and tin oxide (SnO). The common gate electrode 234, the first upper gate insulating layer 236, and the first upper channel layer 238 may be a bottom gate thin film transistor or a p-type thin film transistor.

The first upper electrode 240 may be provided on portions of the first upper gate insulating layer 236 and the first upper channel layer 238 of the first spacer 224. The first upper electrode 240 may be connected to one side of the first upper channel layer 238. The first upper electrode 240 may include the same material as that of each of the first lower electrode, the first middle electrode 232, and the common gate electrode 234. For example, the first upper electrode 240 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The first contact electrode 230 may be provided on portions of the first upper gate insulating layer 236 and the first upper channel layer 238 of the first lower electrode 222. The first contact electrode 230 may pass through the first upper gate insulating layer 236 and the first lower gate insulating layer 228 so as to be connected to the first lower electrode 222. The first contact electrode 230 may be connected to another side of the first upper channel layer 238. The first contact electrode 230 may include the same material as that of the first upper electrode 240. For example, the first contact electrode 230 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The first protective layer 242 may be provided on the first contact electrode 230, the first upper channel layer 238, and the first upper electrode 240. The first protective layer 242 may have a flat top surface. The first protective layer 242 may include silicon oxide or a polymer, but an embodiment of the inventive concept is not limited thereto.

The first lower channel layer 226, the first lower gate insulating layer 228, and the common gate electrode 234 may implement an n-type thin film transistor, and the first upper channel layer 238, the first upper gate insulating layer 236, and the common gate electrode 234 may implement a p-type thin film transistor. The n-type and p-type thin film transistors may have a laminated structure. Thus, in the semiconductor device 22 according to an embodiment of the inventive concept, an area of the device may be reduced in a plan view by using the common gate electrode 234 between the first lower channel layer 226 and the first upper channel layer 238. In addition, since the semiconductor device 22 according to an embodiment of the inventive concept has a three-dimensional structure, the area of the device may be minimized.

Figure 3:
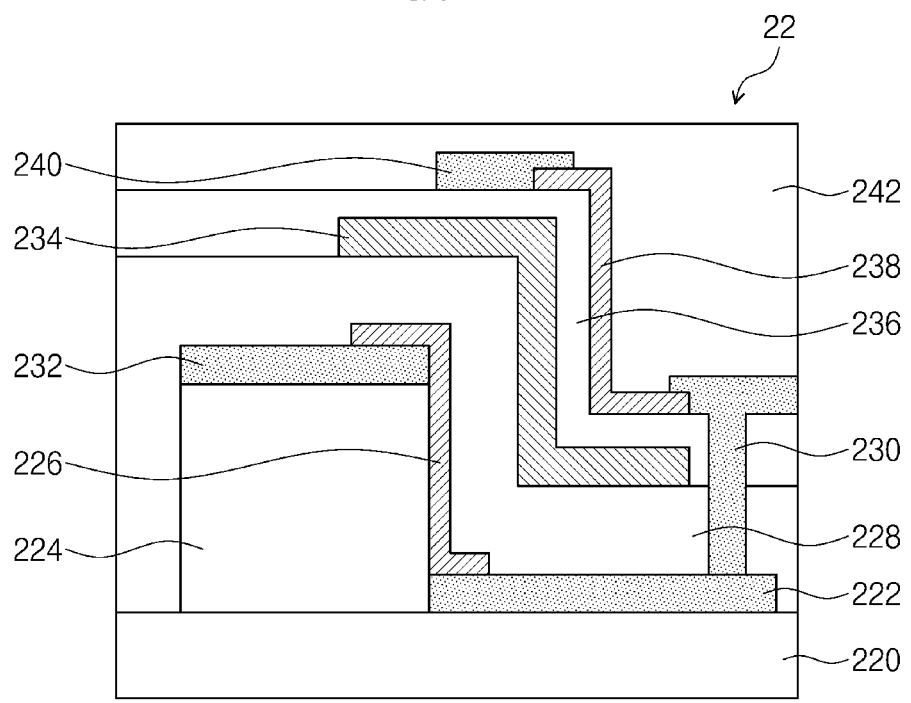
FIG. 3 is a cross-sectional view illustrating an example of the semiconductor device of FIG. 1.

FIG. 3 is a view illustrating an example of the semiconductor device 22 of FIG. 1.

Referring to FIG. 3, the first lower gate insulating layer 228 may have a thickness different from that of the first upper gate insulating layer 236. The first lower gate insulating layer 228 may have a thickness greater than that of the first upper gate insulating layer 236. A threshold voltage of the n-type thin film transistor of the first lower channel layer 226, the first lower gate insulating layer 228, and the common gate electrode 234 may be different from that of the p-type thin film transistor of the first upper channel layer 238, the first upper gate insulating layer 236, and the common gate electrode 234.

A first substrate 220, a first lower electrode 222, a first spacer 224, a first middle electrode 232, a first lower channel layer 226, a common gate electrode 234, a first upper channel layer 238, a first upper electrode 240, a first contact electrode 230, and a first protective layer 242 may have the same configuration as those in FIG. 2.

Figure 4:
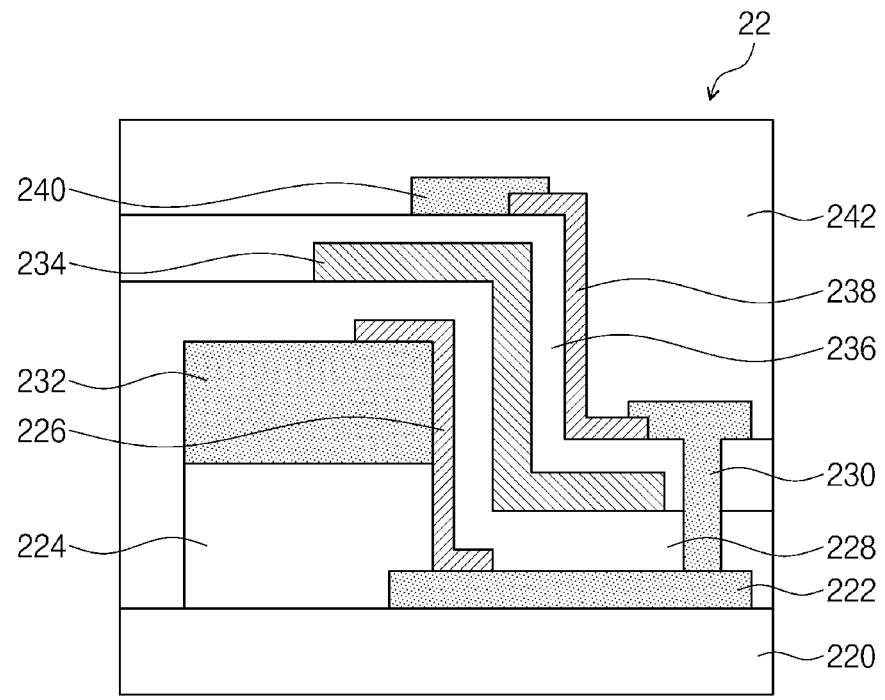
FIG. 4 is a cross-sectional view illustrating an example of the semiconductor device of FIG. 1.

FIG. 4 is a view illustrating an example of the semiconductor device 22 of FIG. 1.

Referring to FIG. 4, the first middle electrode 232 may have a thickness greater than that of each of the first lower electrode 222 and the first upper electrode 240. A length of a depletion region of the first lower channel layer 226 may decrease. Threshold voltages of the n-type thin film transistor and the p-type thin film transistor may be different from each other.

A first substrate 220, a first spacer 224, a first middle electrode 232, a first lower gate insulating layer 228, a common gate electrode 234, a first upper gate insulating layer 236, a first upper channel layer 238, a first upper electrode 240, a first contact electrode 230, and a first protective layer 242 may have the same configuration as those in FIG. 2.

Figure 5:
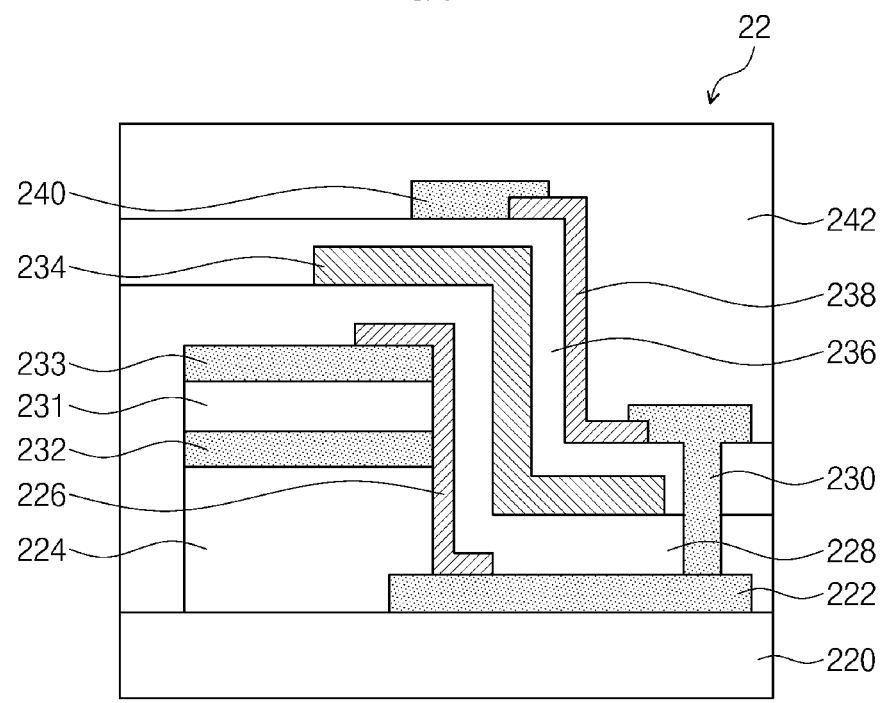
FIG. 5 is a cross-sectional view illustrating an example of the semiconductor device of FIG. 1.

FIG. 5 is a view illustrating an example of the semiconductor device 22 of FIG. 1.

Referring to FIG. 5, the semiconductor device 22 according to an embodiment of the inventive concept may further include an upper spacer 231 and an additional electrode 233.

The upper spacer 231 may be provided on the first middle electrode 232. The upper spacer 231 may allow the length of the first lower channel layer 226 to increase. The upper spacer 231 may have the same material as that of the first spacer 224. For example, the upper spacer 231 may include silicon oxide ($SiO_2$). Alternatively, the upper spacer 231 may include silicon nitride ($SiN_x$), silicon nitride oxide ($SiO_xN_y$), aluminum oxide ($Al_2O_3$), a carbon-containing silicon oxide film (SiOC or SiOCH), and a siloxane polymer.

The additional electrode 233 may be provided on the upper spacer 231. The additional electrode 233 may be provided between the upper spacer 231 and the first lower channel layer 226. The additional electrode 233 may be connected to an end of the first lower channel layer 226. The additional electrode 233 may include the same material as that of each of the first lower electrode 222 and the first upper electrode 240. For example, the additional electrode 233 may include metal oxide such as tin oxide (Indium Tin Oxide), indium zinc oxide (Indium Zinc Oxide), and aluminum zinc oxide (Aluminum Zinc Oxide), a metal such as molybdenum (Mo), aluminum (Al)), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

A first substrate 220, a first substrate 220, a first lower electrode 222, a first spacer 224, a first middle electrode 232, a first lower channel layer 226, a first lower gate insulating layer 228, a common gate electrode 234, a first upper gate insulating layer 236, a first upper channel layer 238, a first upper electrode 240, a first contact electrode 230, and a first protective layer 242 may have the same configuration as those in FIG. 2.

Figure 6:
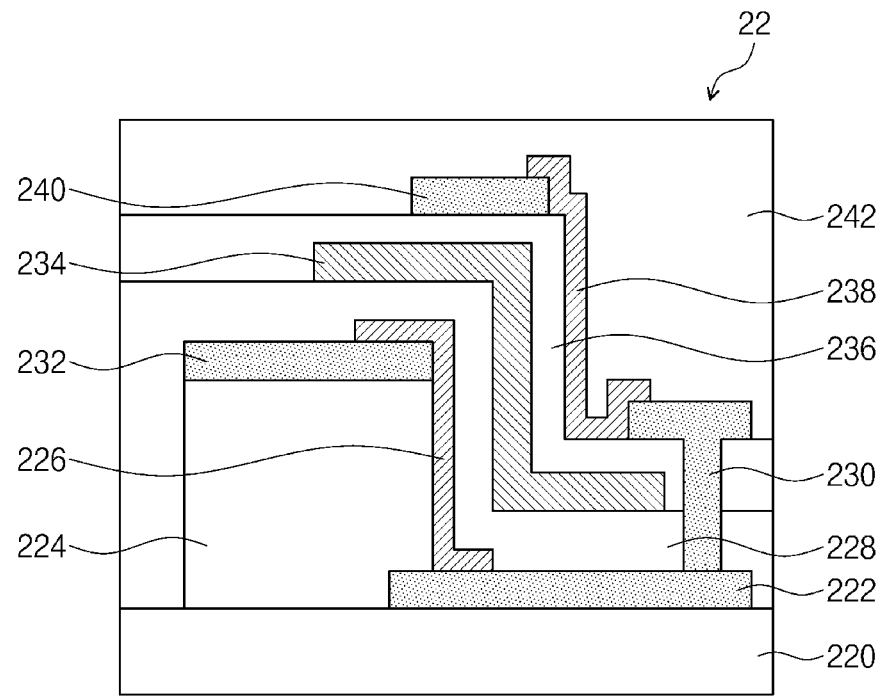
FIG. 6 is a cross-sectional view illustrating an example of the semiconductor device of FIG. 1.

FIG. 6 is a view illustrating an example of the semiconductor device 22 of FIG. 1.

Referring to FIG. 6, the first upper channel layer 238 may be provided on the first upper electrode 240 and the first contact electrode 230. Before forming the first upper electrode 240 and the first contact electrode 230, the first upper channel layer 238 may be sequentially deposited and patterned with the first protective layer 242. Etch damage of the first upper channel layer 238 may be reduced. Thus, damage of the first upper channel layer 238 may be reduced or minimized.

A first substrate 220, a first lower electrode 222, a first spacer 224, a first middle electrode 232, a first lower channel layer 226, a first lower gate insulating layer 228, a common gate electrode 234, a first upper gate insulating layer 236, and a first protective layer 242 may have the same configuration as those in FIG. 2.

Figure 7:
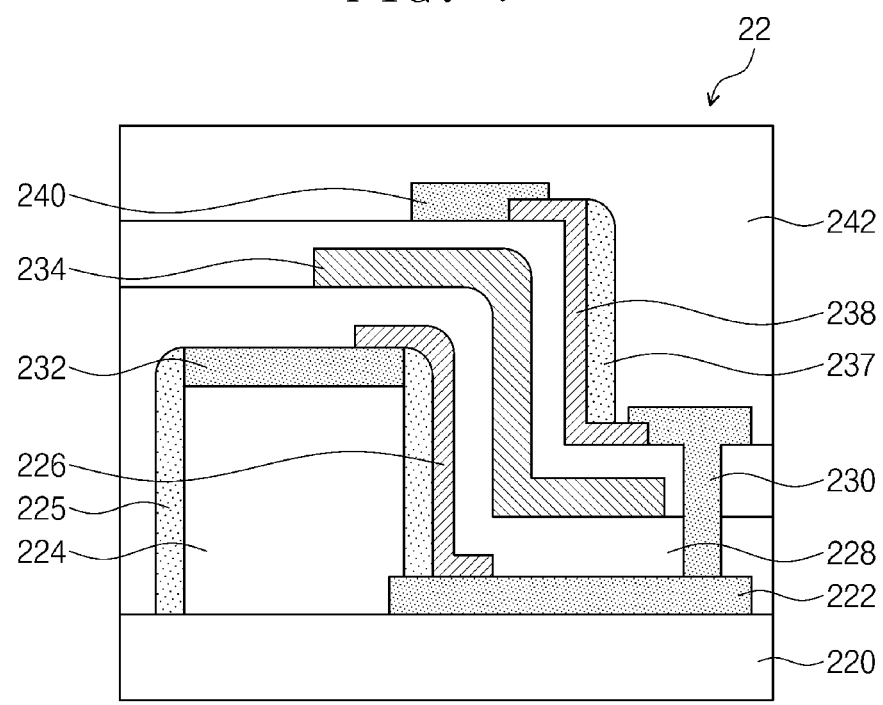
FIG. 7 is a cross-sectional view illustrating an example of the semiconductor device of FIG. 1.

FIG. 7 is a view illustrating an example of the semiconductor device 22 of FIG. 1.

Referring to FIG. 7, the semiconductor device 22 according to an embodiment of the inventive concept may further include a lower buffer spacer 225 and an upper buffer spacer 237.

The lower buffer spacer 225 may be provided on sidewalls of the first spacer 224 and the first middle electrode 232. The lower buffer spacer 225 may gently cover upper corners of the first spacer 224 and the first middle electrode 232. Thus, the corner of the first lower channel layer 226 on the lower buffer spacer 225 may be rounded without being bent. The lower buffer spacer 225 may be formed by a self-alignment method. The lower buffer spacer 225 may include $SiO_2$, $Al_2O_3$, or $SiN_x$ formed through a chemical vapor deposition method or an atomic layer deposition method.

The upper buffer spacer 237 may be provided on a sidewall of the first upper channel layer 238. The upper buffer spacer 237 may protect the first upper channel layer 238. The upper buffer spacer 237 may include the same material as that of the lower buffer spacer 225. For example, the upper buffer spacer 237 may include $SiO_2$, $Al_2O_3$, or $SiN_x$ formed through a chemical vapor deposition method or an atomic layer deposition method.

A first substrate 220, a first substrate 220, a first lower electrode 222, a first spacer 224, a first middle electrode 232, a first lower channel layer 226, a first lower gate insulating layer 228, a common gate electrode 234, a first upper gate insulating layer 236, a first upper channel layer 238, a first upper electrode 240, a first contact electrode 230, and a first protective layer 242 may have the same configuration as those in FIG. 2.

Figure 8:
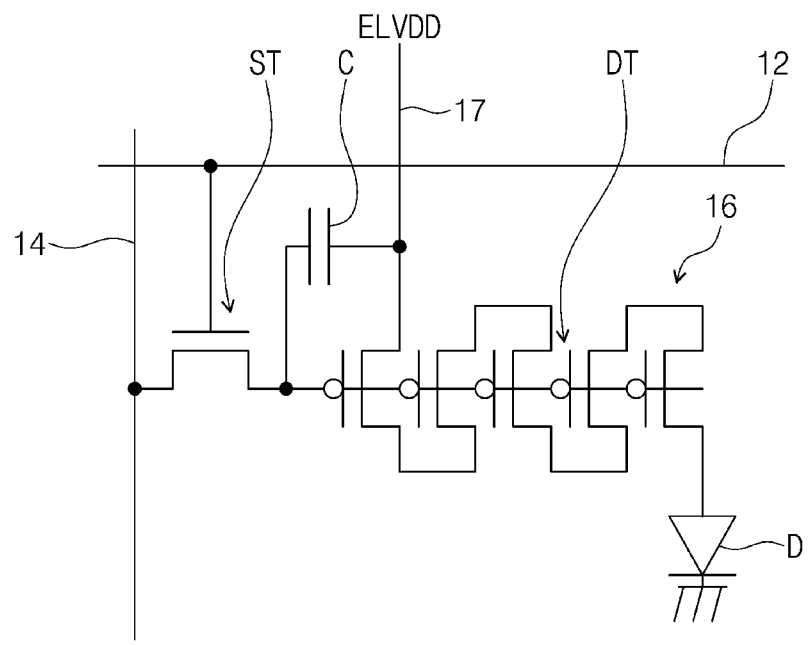
FIG. 8 is a circuit diagram illustrating an example of a pixel of FIG. 1.

FIG. 8 is a view illustrating an example of the pixel 16 of FIG. 1.

Referring to FIG. 8, the pixel 16 may include a selection transistor ST, driving transistors DT, a capacitor C, and a light emitting diode D.

The selection transistor ST may be connected to the scan line 12 and the data line 14. The selection transistor ST may be turned on by the scan signal of the scan line 12 to provide the data signal of the data line 14 to the driving transistors DT.

The driving transistors DT may be connected to the selection transistor ST. The driving transistors DT may be connected to a power line 17. The driving transistors DT may be connected in series. The driving transistors DT may provide power to the light emitting diode D in response to the data signal.

The capacitor C may be connected to a gate electrode and a source electrode of each of the driving transistor DT. The capacitor C may be connected to the source electrode of the driving transistor DT and a drain electrode of the selection transistor ST. The capacitor C may allow the driving transistor DT to operate as a diode.

The light emitting diode D may be connected to the drain electrodes of the driving transistors DT. The light emitting diode D may be grounded. The light emitting diode D may emit light in response to the scan signal and the data signal.

Figure 9:
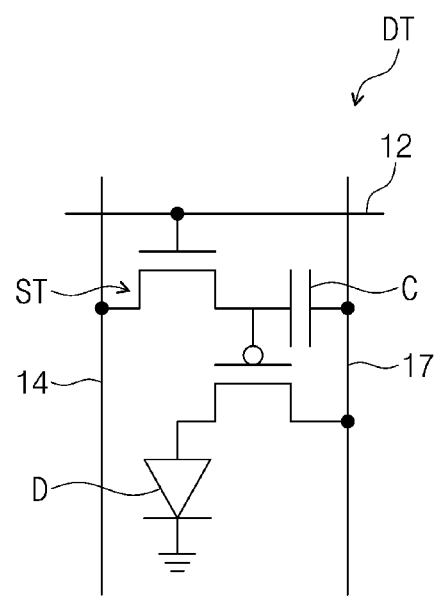
FIG. 9 is a circuit diagram illustrating an example of the pixel of FIG. 1.

FIG. 9 is a view illustrating an example of the pixel 16 of FIG. 1.

Referring to FIG. 9, the pixel 16 may further include a power electrode 17. The power electrode 17 may be connected to the capacitor C and the driving transistor DT. When the selection transistor ST is turned on, the power electrode 17 may provide power to the driving transistor DT and the light emitting diode D to emit light.

The scan line 12, the data line 14, the selection transistor ST, the driving transistor DT, the capacitor C, and the light emitting diode D may have the same configuration as those in FIG. 8.

Figure 10:
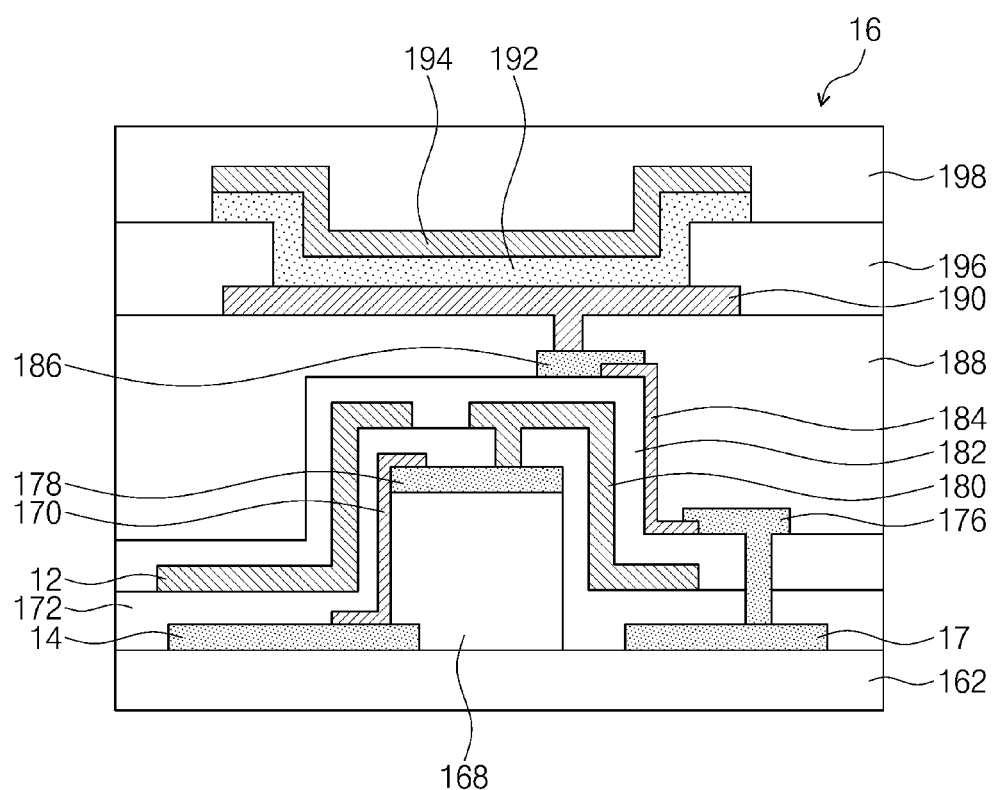
FIG. 10 is a cross-sectional view illustrating an example of a display panel of FIG. 1.

FIG. 10 is a view illustrating an example of the display panel 10 of FIG. 1.

Referring to FIGS. 9 and 10, the display panel may include a second substrate 162, a data line 14, a power electrode 17, a second spacer 168, a second middle electrode 178, a second lower channel layer 170, a second lower gate insulating layer 172, a scan line 12, a driving gate electrode 180, a second upper gate insulating layer 182, a second upper electrode 186, a second upper channel layer 184, a second contact electrode 176, a first interlayer insulating layer 188, an anode 190, a second interlayer insulating layer 196, a light emitting layer 192, a cathode 194, and a second protective layer 198.

The second substrate 162 may be flat. The second substrate 162 may include glass or polyimide.

The data line 14 may be provided at one side of the second substrate 162. The data line 14 may include metal oxide such as indium tin oxide, indium zinc oxide, and aluminum zinc oxide. Alternatively, the data line 14 may include molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag). The data line 14 may include a multilayer structure of Mo—Al—Mo, Mo-ITO, ITO-Ag-ITO, or AZO-Ag-AZO.

The power electrode 17 may be provided at another side of the second substrate 162. The power electrode 17 may include the same material as that of the data line 14. The power electrode 17 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The second spacer 168 may be provided on the second substrate 162 between the data line 14 and the power electrode 17. The second spacer 168 may be provided on a portion of the data line 14. The second spacer 168 may be thicker than that of each of the data line 14 and the power electrode 17. The second spacer 168 may include the same material as that of the first spacer 224. For example, the second spacer 168 may include silicon oxide ($SiO_2$). Alternatively, the second spacer 168 may include silicon nitride ($SiN_x$), silicon nitride oxide ($SiO_xN_y$), aluminum oxide ($Al_2O_3$), a carbon-containing silicon oxide film (SiOC or SiOCH), and a siloxane polymer.

The second middle electrode 178 may be provided on the second spacer 168. The second middle electrode 178 may include the same material as that of the first middle electrode 232. For example, the second middle electrode 178 may include metal oxide such as tin oxide (Indium Tin Oxide), indium zinc oxide (Indium Zinc Oxide), and aluminum zinc oxide (Aluminum Zinc Oxide), a metal such as molybdenum (Mo), aluminum (Al)), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The second lower channel layer 170 may be connected between the data line 14 and the second middle electrode 178. The second lower channel layer 170 may be provided on one sidewall of the second spacer 168, the data line 14, and the second middle electrode 178. The second lower channel layer 170 may include the same material as that of the first lower channel layer 226. For example, the second lower channel layer 170 may include amorphous silicon (a-Si), low temperature polysilicon (LTPS), or an n-type oxide semiconductor. The n-type oxide semiconductors may include indium gallium zinc oxide (IGZO), indium tin zinc oxide (ITZO), indium zinc oxide (IZO), indium oxide (InO$_x$), zinc tin oxide (ZTO), and indium gallium tin oxide (IGTO), and indium gallium zinc tin oxide (IGZTO). The second lower channel layer 170 may be formed through sputtering, plasma chemical vapor deposition (PECVD), or atomic layer deposition (ALD).

The second lower gate insulating layer 172 may be provided on the data line 14, the second lower channel layer 170, the second middle electrode 178, the power electrode 17, and the second substrate 162. The second lower gate insulating layer 172 may include the same material as that of the first lower gate insulating layer 228. The second lower gate insulating layer 172 may include silicon oxide (SiO$_2$), silicon nitride (SiN$_x$), silicon nitride oxide (SiO$_x$N$_y$), aluminum oxide (Al$_2$O$_3$), hafnium oxide (HfO$_x$), and zirconium oxide (ZrO$_x$). The second lower gate insulating layer 172 may be formed through plasma chemical vapor deposition (PECVD) or atomic layer deposition (ALD).

The scan line 12 may be provided on the second lower gate insulating layer 172 of the second lower channel layer 170. The scan line 12 may be provided above one sidewall of the second spacer 168. The scan line 12 may be longer than the second lower channel layer 170 in a vertical view. The second lower channel layer 170, the second lower gate insulating layer 172, and the scan line 12 may function as a top gate transistor or an n-type thin film transistor. That is, the second lower channel layer 170, the second lower gate insulating layer 172, and the scan line 12 may be the selection transistor ST of FIG. 9.

The driving gate electrode 180 may be provided on the second lower gate insulating layer 172 of another sidewall of the second spacer 168. The driving gate electrode 180 may pass through the second lower gate insulating layer 172 and may be connected to the second middle electrode 178. The driving gate electrode 180 may be longer than the second upper channel layer 18 in a vertical view. The scan line 12 and the driving gate electrode 180 may include the same material as that of the common gate electrode 234. Each of the scan line 12 and the driving gate electrode 180 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The second upper gate insulating layer 182 may be provided on the scan line 12, the driving gate electrode 180, and the second lower gate insulating layer 172. The second upper gate insulating layer 182 may include the same material as that of the second lower gate insulating layer 172. The second top gate insulating layer 182 may include silicon oxide (SiO$_2$), silicon nitride (SiN$_x$), silicon nitride oxide (SiO$_x$N$_y$), aluminum oxide (Al$_2$O$_3$), hafnium oxide (HfO$_x$), and zirconium oxide (ZrO$_x$). The second upper gate insulating layer 182 may be formed through plasma chemical vapor deposition (PECVD) or atomic layer deposition (ALD).

The second upper channel layer 184 may be provided on one sidewall of the second upper gate insulating layer 182. The second upper channel layer 184 may be provided between the driving gate electrode 180 and the second upper electrode 186. The second upper channel layer 184 may be provided between the second contact electrode 176 and the driving gate electrode 180. The second upper channel layer 184 may have a length less than that of the driving gate electrode 180. The second upper channel layer 184 may include the same material as that of the first upper channel layer 238. For example, the second upper channel layer 184 may include a p-type oxide semiconductor. The p-type oxide semiconductor may include copper oxide (CuO) and tin oxide (SnO). The driving gate electrode 180, the second upper gate insulating layer 182, and the second upper channel layer 184 may function as a bottom gate transistor or a p-type transistor. That is, the driving gate electrode 180, the second upper gate insulating layer 182, and the second upper channel layer 184 may be the driving transistor DT of FIG. 9.

The second upper electrode 186 may be provided on portions of the second middle electrode 178, the second upper channel layer 184, and the second upper gate insulating layer 182. The second upper electrode 186 may connect the second upper channel layer 184 to the anode 190. The second upper electrode 186 may include the same material as that of the first upper electrode 240. For example, the second upper electrode 186 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The second contact electrode 176 may be provided on the power electrode 17. The second contact electrode 176 may pass through the second lower gate insulating layer 172 and the second upper gate insulating layer 182 so as to be connected to the power electrode 17. The second contact electrode 176 may be provided on a portion of the second upper channel layer 184. The second contact electrode 176 may connect the second upper channel layer 184 to the power electrode 17. The second contact electrode 176 may include the same material as that of the first contact electrode 230. The second contact electrode 176 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The first interlayer insulating layer 188 may be provided on the second contact electrode 176, the second upper electrode 186, and the second upper channel layer 184. The first interlayer insulating layer 188 may have a flat top surface. The first interlayer insulating layer 188 may include silicon oxide or a polymer, but an embodiment of the inventive concept is not limited thereto.

The anode 190 may be provided on the second upper electrode 186 and the first interlayer insulating layer 188. The anode 190 may pass through the first interlayer insulating layer 188 and may be connected to the second upper electrode 186. The anode 190 may include metal oxide such as indium tin oxide, indium zinc oxide, and aluminum zinc oxide, a metal such as molybdenum (Mo), aluminum (Al), titanium (Ti), titanium nitride (TiN), tungsten (W), tungsten titanium (TiW), copper (Cu), gold (Au), platinum (Pt), nickel (Ni), and silver (Ag), or a multilayer structure of Mo—Al—Mo, Mo-ITO, ITO-Ag-ITO, or AZO-Ag-AZO.

The second interlayer insulating layer 196 may be provided on both edges of the anode 190 and on the first interlayer insulating layer 188. The second interlayer insulating layer 196 may partially expose a center of the anode 190. The second interlayer insulating layer 196 may include silicon oxide or a polymer, but an embodiment of the inventive concept is not limited thereto. The second interlayer insulating layer 196 may separate the light emitting layer 192 so as not to interfere between the pixels.

The light emitting layer 192 may be provided on the center of the anode 190 and a portion of the second interlayer insulating layer 196. The light emitting layer 192 may include an organic polymer, but an embodiment of the inventive concept is not limited thereto. The light emitting layer 192 may emit light using power provided to the power electrode 17.

The cathode 194 may be provided on the light emitting layer 192. The cathode 194 may include a transparent electrode. For example, the cathode 194 may include metal oxide such as indium tin oxide, indium zinc oxide, and aluminum zinc oxide, but an embodiment of the inventive concept is not limited thereto.

The second protective layer 198 may be provided on the cathode 194 and the second interlayer insulating layer 196. The second protective layer 198 may include a transparent organic material. The second protective layer 198 may include silicon oxide. Alternatively, the second protective layer 198 may include silicon nitride or a polymer, but an embodiment of the inventive concept is not limited thereto.

Figure 11:
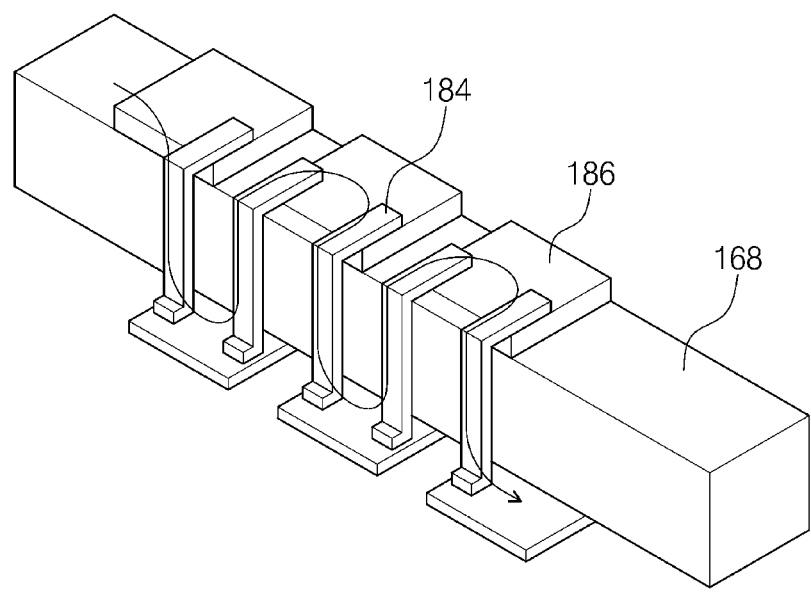
FIG. 11 is a perspective view illustrating an example of second upper channel layers and a second upper electrode of driving transistors of FIG. 8.

FIG. 11 is a perspective view illustrating an example of the second upper channel layers 184 and the second upper electrode 186 of the driving transistors DT of FIG. 8.

Referring to FIG. 11, the second upper channel layers 184 and the second upper electrode 186 may be connected along a sidewall of the second spacer 168 in proportion to the number of driving transistors DT. An effective channel length of each of the driving transistors DT may increase in proportion to the number of the driving transistors DT.

In the semiconductor device according to the inventive concept, the circuit may be reduced in area by using the lower and upper channel layers, which are provided on the sidewall of the spacer in the direction perpendicular to the substrate, and the common gate electrode between the two channel layers.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A semiconductor device comprising:
a lower electrode on one side of a substrate;
a spacer on a portion of the lower electrode and another side of the substrate;
a middle electrode on the spacer;
a lower channel layer on portions of a sidewall of the spacer, the middle electrode, and the lower electrode;
a lower gate insulating layer on the lower channel layer;
a common gate electrode on the gate insulating layer corresponding to the lower channel layer;
an upper gate insulating layer on the common gate electrode;
an upper electrode on the spacer and the upper gate insulating layer of the middle electrode;
an upper channel layer connected to the upper electrode and disposed on a sidewall of the upper gate insulating layer; and
a contact electrode connected to a portion of the upper channel layer and passing through the lower gate insulating layer and the upper gate insulating layer outside the common gate electrode so as to be connected to the lower electrode.

2. The semiconductor device of claim 1, wherein the lower channel layer, the lower gate insulating layer, and the common gate electrode is an n-type thin film transistor.

3. The semiconductor device of claim 1, wherein the upper channel layer, the upper gate insulating layer, and the common gate electrode is a p-type thin film transistor.

4. The semiconductor device of claim 1, wherein the lower gate insulating layer is thicker than the upper gate insulating layer.

5. The semiconductor device of claim 1, wherein the middle electrode has a thickness different from that of each of the lower electrode and the upper electrode.

6. The semiconductor device of claim 5, wherein the middle electrode is thicker than each of the lower electrode and the upper electrode.

7. The semiconductor device of claim 1, further comprising:
an upper spacer provided between the middle electrode and the lower gate insulating layer; and
an additional electrode between the upper spacer and the lower gate insulating layer.

8. The semiconductor device of claim 1, wherein the common gate electrode is wider than each of the lower channel layer and the upper channel layer.

9. The semiconductor device of claim 1, further comprising:
a lower buffer spacer between a sidewall of the spacer and the lower channel layer; and
an upper buffer spacer on a sidewall of the upper channel layer.

10. The semiconductor device of claim 9, wherein the lower buffer spacer and upper buffer spacer are thicker than the lower electrode.

11. A display panel comprising:
a data line on one side of a substrate;
a power electrode on another side of the substrate;
a spacer on the substrate between the data line and the power electrode;
a middle electrode on the spacer;
a lower channel layer configured to connect the middle electrode to the data line along one sidewall of the spacer;
a lower gate insulating layer on the lower channel layer, the middle electrode, the data line, and the power electrode;
a scan line on the lower gate insulating layer of one sidewall of the spacer;
a driving gate electrode on the lower gate insulating layer of another sidewall of the spacer;
an upper gate insulating layer on the scan line and the driving gate electrode;
an upper electrode on the upper gate insulating layer of the spacer;
an upper channel layer connected to the upper electrode and disposed on the upper gate insulating layer of another sidewall of the spacer;

a contact electrode connected to the upper channel layer and passing through the lower gate insulating layer and the upper gate insulating layer so as to be connected to the power electrode;

a first interlayer insulating layer on the contact electrode, the upper channel layer, the upper electrode, and the upper gate insulating layer;

an anode provided on the first interlayer insulating layer and passing through the first interlayer insulating layer so as to be connected to the upper electrode;

a second interlayer insulating layer on both edges of the anode and the first interlayer insulating layer;

a light emitting layer on the anode and the second interlayer insulating layer; and a cathode on the light emitting layer.

12. The display panel of claim 11, wherein the scan line has a length greater than that of the lower channel layer.

13. The display panel of claim 11, wherein the upper channel layer has a length less than that of the driving gate electrode.

14. The display panel of claim 11, wherein the driving gate electrode passes through the lower gate insulating layer so as to be connected to the middle electrode.

15. The display panel of claim 11, further comprising a protective layer on the cathode.

16. A display device comprising:

a display panel; and a driving circuit having a semiconductor device connected to an edge of the display panel to provide a scan signal and a data signal that control the display panel, wherein the semiconductor device comprises:

a lower electrode on one side of a first substrate;

a spacer on a portion of the lower electrode and another side of the first substrate;

a middle electrode on the spacer;

a lower channel layer on portions of a sidewall of the spacer, the middle electrode, and the lower electrode;

a lower gate insulating layer on the lower channel layer;

a common gate electrode on the gate insulating layer corresponding to the lower channel layer;

an upper gate insulating layer on the common gate electrode;

an upper electrode on the spacer and the upper gate insulating layer of the middle electrode;

an upper channel layer connected to the upper electrode and disposed on a sidewall of the upper gate insulating layer; and a contact electrode connected to a portion of the upper channel layer and passing through the lower gate insulating layer and the upper gate insulating layer outside the common gate electrode so as to be connected to the lower electrode.

17. The display device of claim 16, wherein the semiconductor device comprises an inverter circuit.

18. The display device of claim 16, wherein the display panel comprises:

a data line extending in one direction on the second substrate; and a scan line crossing the data line, wherein the semiconductor device is connected to the scan line.

19. The display device of claim 16, wherein the driving circuit comprises:

a scan driving circuit connected to an edge of one side of the display panel; and a data driving circuit arranged to cross the scan driving circuit.

20. The display device of claim 19, wherein the scan driving circuit comprises the semiconductor device.

* * * * *